United States Patent [19]

Mita

[11] Patent Number: 5,757,346
[45] Date of Patent: May 26, 1998

[54] LIQUID CRYSTAL DISPLAY DRIVING DEVICE AND LIQUID CRYSTAL INSPECTION METHOD USING THE SAME

[75] Inventor: Hiroaki Mita, Ome, Japan

[73] Assignee: Casio Computer Co., Ltd., Tokyo, Japan

[21] Appl. No.: 918,649

[22] Filed: Aug. 22, 1997

Related U.S. Application Data

[63] Continuation of Ser. No. 456,565, Jun. 1, 1995, abandoned.

[30] Foreign Application Priority Data

Jun. 8, 1994 [JP] Japan .................................. 6-151532

[51] Int. Cl.$^6$ .................................................. G09G 3/36
[52] U.S. Cl. ............................................ 345/87; 345/98
[58] Field of Search .................................. 345/3, 81, 89, 345/147, 904, 98, 204; 348/92; 324/500, 527, 770; 382/141, 145, 147, 149

[56] References Cited

U.S. PATENT DOCUMENTS 5,293,178  3/1994  Kobayashi ................................ 345/87
5,488,385  1/1996  Singhal ..................................... 345/3
5,515,068  5/1996  Uragami .

FOREIGN PATENT DOCUMENTS

24229   1/1990  Japan ..................................... 345/904
6266325 9/1994  Japan ..................................... 345/904

*Primary Examiner*—Regina Liang
*Attorney, Agent, or Firm*—Frishauf, Holtz, Goodman, Langer & Chick

[57] ABSTRACT

A technique for inspecting a liquid-crystal display module which includes a liquid-crystal panel and a liquid-crystal display driving device, wherein the liquid-crystal display driving device is provided with a selecting section for selectively switching between (i) outputting of various data items stored in a memory section to an inspection device and (ii) outputting of the stored data to a driving section to drive a liquid-crystal panel, on the basis of execution instruction data from the inspection device. The inspection device selectively writes and reads character data into and from a DDRAM, a CGROM, and a CGRAM in the memory section of the liquid-crystal display driving device one after another and inspects the display in sequence.

7 Claims, 5 Drawing Sheets

| LEFTMOST/RIGHTMOST | CGRAM | CGROM | | | |
|---|---|---|---|---|---|
| | 0000 | 0001 | 0010 | ..... | 1111 |
| 0000 | (1) | A | B | ..... | Z |
| 0001 | (2) | a | b | ..... | z |
| 0010 | (3) | ア | イ | ..... | ン |
| | | | | . | |
| | | | | . | |
| | | | | . | |
| 1110 | (N-1) | 1 | 2 | ..... | 0 |
| 1111 | (N) | @ | ¥ | ..... | £ |

FIG.8

ONE CHARACTER:
5 DOTS IN WIDTH × 8 DOTS IN HEIGHT

FIG.9

LIQUID CRYSTAL DISPLAY DRIVING DEVICE AND LIQUID CRYSTAL INSPECTION METHOD USING THE SAME

This application is a Continuation of application Ser. No. 08/456,565, filed Jun. 1, 1995 now abandoned.

BACKGROUND OF THE INVENTION

1. Field of the Invention

This invention relates to a liquid-crystal display driving device which displays various data items previously stored in a memory on a liquid-crystal panel on the basis of externally supplied instructions, and more particularly to a liquid-crystal display driving device which selectively switches between an external device and a liquid-crystal panel and displays various data items stored in the memory according to external instructions. This invention also relates to a liquid crystal inspection method using the liquid-crystal display driving device.

2. Description of the Related Art

To make liquid-crystal display devices smaller and faster, a memory, such as a ROM (Read only Memory) or a RAM (Random Access Memory) that stores character data or previously specified display data in a fixed format, has been integrated together with a liquid-crystal display driving circuit into a module. Modules of this type are now available on the market.

A conventional liquid-crystal display driving device, into which such a memory and driving circuit are modularized together with a liquid-crystal panel, contains an interface circuit, a decoder, a control circuit, a DDRAM (Display Data RAM), a CGRAM (Character Generator RAM), a CGROM (Character Generator ROM), a data conversion circuit, and a liquid-crystal display driving circuit. The liquid-crystal display driving device is incorporated into a small electronic apparatus, such as a cellular phone, and displays characters and symbols on the liquid crystal display of the small electronic apparatus.

The controller of the small electronic apparatus inputs a control signal, instruction signal and if necessary, display data into the interface circuit of the liquid-crystal display driving device. The interface circuit outputs the control signal from the controller to the control circuit and the instruction signal to the decoder.

The decoder decodes the instruction signal inputted via the interface circuit and outputs the decoded signal to the control circuit.

The DDRAM has a memory capacity with display addresses necessary to display a screen of characters on the liquid-crystal panel.

The DDRAM, upon receiving the instruction signal and display data from the controller of the small electronic apparatus, expands the memory addresses of the particular character data stored in the CGRAM and CGROM over the addresses corresponding to the display positions on the liquid-crystal panel.

The CGROM stores display data in a fixed format, for example, characters and symbols, at particular memory addresses.

The CGRAM, upon receiving the instruction signal and display data from the controller of the small electronic apparatus and being specified for addresses at which the display data is to be stored, can store new display data or rewrite the old display data with new display data.

In the CGROM and CGRAM, 8 dots (in height)×5 dots (in width), or 40 dots (bits) form a single character, and a single character is stored in one memory address.

The display data stored in the CGROM and CGRAM is read sequentially as parallel data and outputted to the data conversion circuit, while referring to the memory addresses corresponding to the display addresses stored in the DDRAM, under the control of the control signal from the controller of the small electronic apparatus.

The data conversion circuit converts the parallel display data inputted from the CGRAM and CGROM into serial display data and outputs the serial data to the liquid-crystal display driving circuit.

The liquid-crystal display driving device outputs the driving signal corresponding to the display data to the liquid-crystal panel on the basis of the control signal from the control circuit and the display data inputted from the data conversion circuit, and thereby drives the liquid-crystal panel and displays the characters and symbols corresponding to the display data on the liquid-crystal panel.

The liquid-crystal display driving device and the liquid-crystal panel are coupled together in a module.

In such a conventional liquid-crystal display driving device and liquid crystal inspection method, however, the liquid-crystal display driving device comprises a memory such as a ROM or a RAM that stores display data such as characters and formatted data. When the display data is read from the memory and displayed on a liquid-crystal panel, there may be a case where the correct display data cannot be outputted due to thermal stress, mechanical stress, or short circuit between lines in the process of connecting a liquid-crystal panel to the semiconductor chip of a liquid-crystal display driving device.

Should this happen, proper measures should be taken after finding out whether the faulty process has resulted from defects in the semiconductor chip of the liquid-crystal display driving device, the liquid-crystal panel itself, or faulty wiring connecting them.

To do this, it is necessary to check to see if these memories store the display data properly. Since conventional liquid-crystal display driving devices have only the function of reading the display data from the memory and displaying on the liquid-crystal panel, a check is made to see if the memory has defects by displaying the display data in the memory on the liquid-crystal panel and allowing the contents of the display to be checked through visual inspection.

As described above, with the conventional liquid-crystal display driving devices, checking whether there is any defect in the memory is effected by displaying all of the display data in the memory on the liquid-crystal panel for visual inspection. Therefore, this conventional technique disadvantageously requires time for inspection and an employee to perform the inspection, thereby increasing costs.

SUMMARY OF THE INVENTION

It is, accordingly, an object of the present invention to overcome the disadvantages of the conventional technique by providing a liquid-crystal display driving device which can selectively output display data stored in a memory either to an inspection device or to a liquid-crystal display driving circuit for liquid-crystal panel display in order to make a lower-cost, more accurate, faster inspection, and a liquid crystal display inspection method using the liquid-crystal display driving device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The overall configuration of an embodiment of the present invention will be explained with reference to FIGS. 1, 2, and 3.

Figure 1:
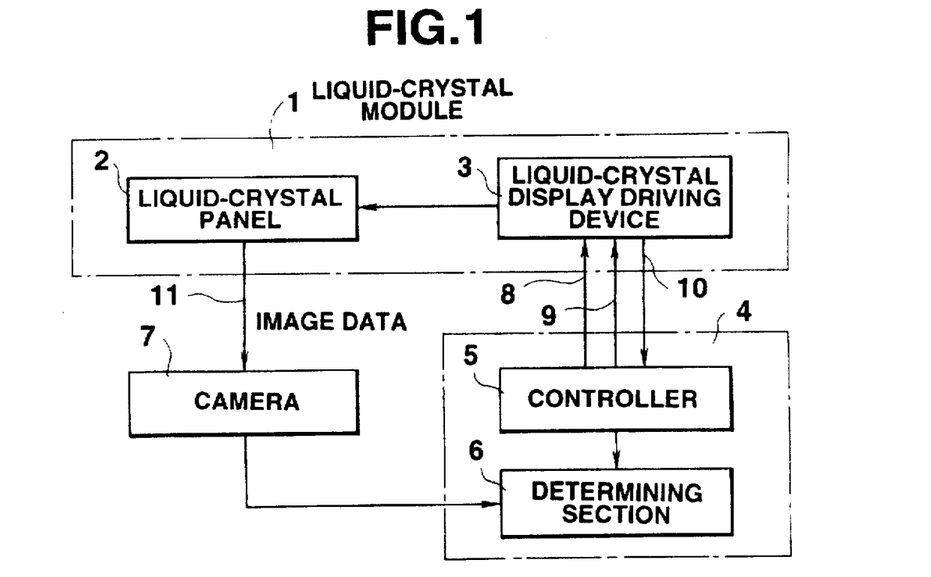
FIG. 1 is an overall schematic diagram of a liquid-crystal display module of the present invention and an embodiment of an inspection device for inspecting the liquid-crystal display module.

FIG. 1 is an overall schematic diagram of a liquid-crystal display module 1, an inspection device 4 that inspects the liquid-crystal display module, and a camera 7.

Figure 2:
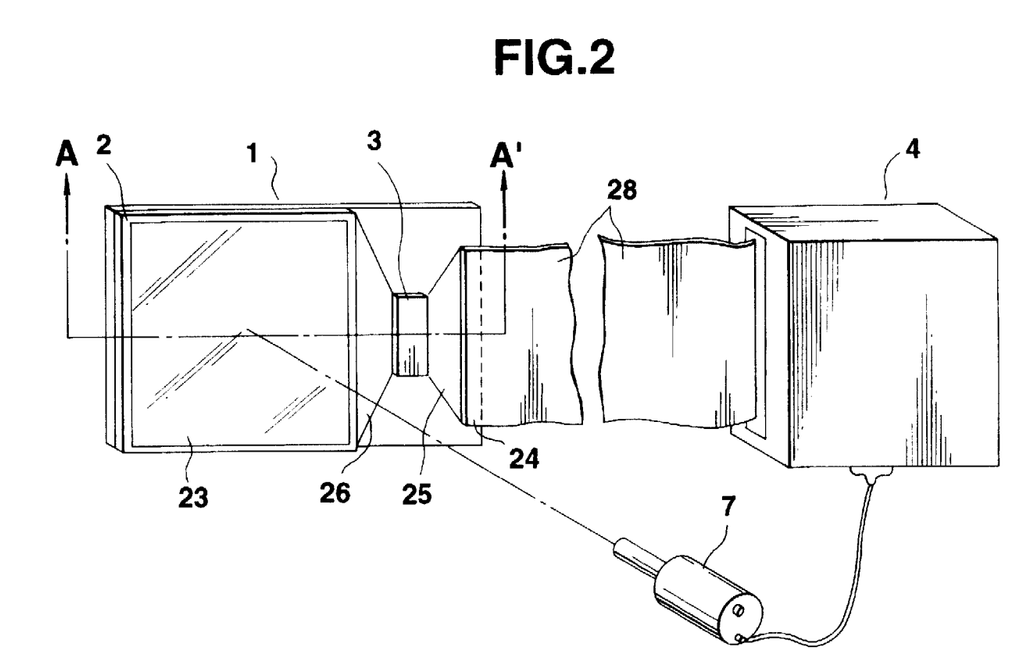
FIG. 2 is a schematic diagram to help explain how to inspect the liquid-crystal display module.
Figure 3:
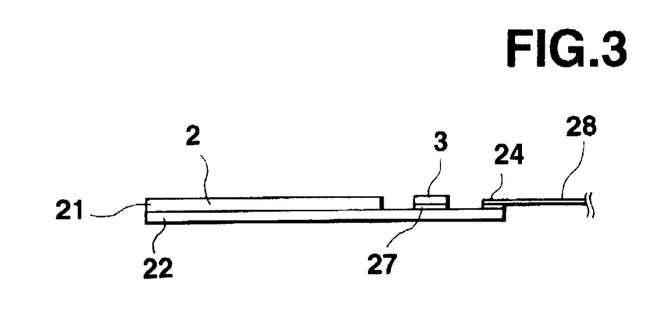
FIG. 3 is a sectional view of the liquid-crystal display module of FIG. 2.

FIG. 2 is a drawing to help explain how to inspect the liquid-crystal display module 1. FIG. 3 is a sectional view of the liquid-crystal display module.

The liquid-crystal display module 1, which will be explained in detail, is composed of a liquid-crystal panel 2, a liquid-crystal display driving device 3, and an FPC (Flat Package Cable) 28 connected to an external device (not shown).

An inspection device 4, which will be explained in detail later, is made up of a controller 5 and determining section 6.

The inspection device 4 supplies execution instruction data 8 to execute inspection and a reference voltage 9 to the liquid-crystal display module 1 via an FPC 28.

The liquid-crystal display driving device 3 installed on the liquid-crystal display module 1 generates inspection data 10 on the basis of the execution instruction data 8 and outputs the generated data to the inspection device 4 via the FPC 28.

The liquid-crystal panel 2 installed on the liquid-crystal display module 1 displays data on the basis of the execution instruction data 8 under the control of the display driving signal generated by the liquid-crystal display driving device 3.

The camera 7 senses the display state of the liquid-crystal panel 2 in the form of image data 11 and supplies the image data to the inspection device 4.

The liquid-crystal display module 1 comprises the liquid-crystal panel 2, the liquid-crystal display driving device 3 bonded on the lower substrate 22 of the liquid-crystal panel 2, a terminal section 24 formed on the lower substrate 22, and an FPC 28 connected to the terminal section.

The liquid-crystal panel 2 is made up of the upper substrate 21 and the lower substrate 22 whose area is greater than that of the upper substrate 21 and which is stacked on the upper one.

The liquid-crystal panel 2 has the upper substrate 21 and lower substrate 22 stacked one on top of another and its peripheral portion sealed. The panel comprises a display area 23 inside the peripheral portion and a portion where the upper substrate 21 is not stacked on the lower substrate 22.

The liquid-crystal panel 2 comprises an area in which the liquid-crystal display driving device 3 is to be installed almost in the center of the portion where the upper substrate is not stacked on the lower substrate 22, a terminal section 24 for receiving the input signal from an external device (not shown) via the FPC 28, an input signal wiring section 25 for connecting the terminal section 24 to the liquid-crystal display driving device 3, and an output signal wiring section 26 to be wired to the liquid-crystal display driving device 3 and display area 23.

The terminal section 24, the input signal wiring section 25, and the output signal wiring section 26 are each formed of a transparent conducting film.

The liquid-crystal display driving device 3 is made up of a one-chip semiconductor element.

The liquid-crystal display driving device 3 is connected via an anisotropic conductive adhesive 27 to the input signal wiring section 25 and output signal wiring section 26 wired on the lower substrate 22.

The signal lines for the execution instruction data 8, reference voltage 9, and inspection data 10 from the external device (not shown) are connected to the terminal section 24 via the FPC 28.

The anisotropic conductive adhesive 27 connects the terminal section 24 to the FPC 28.

The other end of the FPC 28 connected to the terminal section 24 has a connector detachably connectable to an external device (not shown) such as the controller of a small electronic apparatus.

The FPC 28 connects the execution instruction data 8 and reference voltage 9 supplied from the inspection device 4 to the liquid-crystal display module 1 and the inspection data 10 supplied from the liquid-crystal display module 1 to the inspection device 4.

The liquid-crystal display module 1 is generally connected to the controller of a small electronic apparatus and driven for display. In this embodiment, however, instead of the controller of the small electronic apparatus, the liquid-crystal display module 1 is connected to the inspection device 4 to inspect the functions of the module 1.

Hereinafter, using FIGS. 4, 5, 6, and 8, a block diagram of the liquid-crystal display module 1 will be described.

Figure 4:
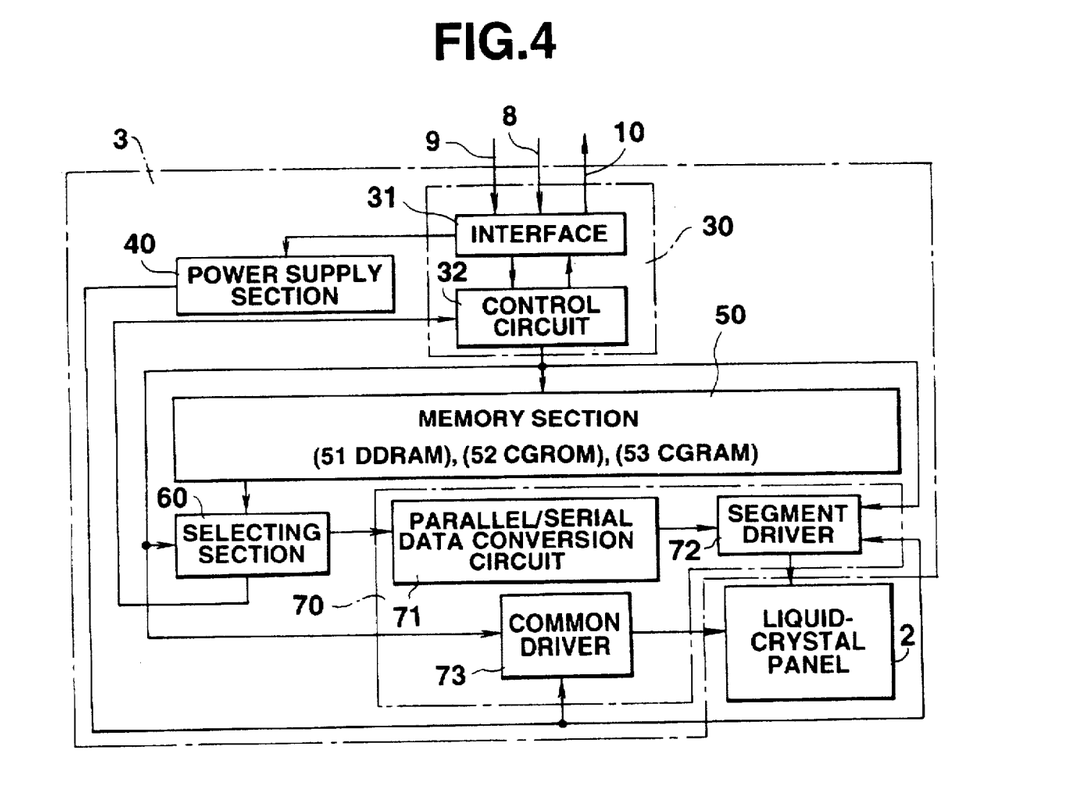
FIG. 4 is a block diagram of the liquid-crystal display module of FIG. 1.
Figure 5:
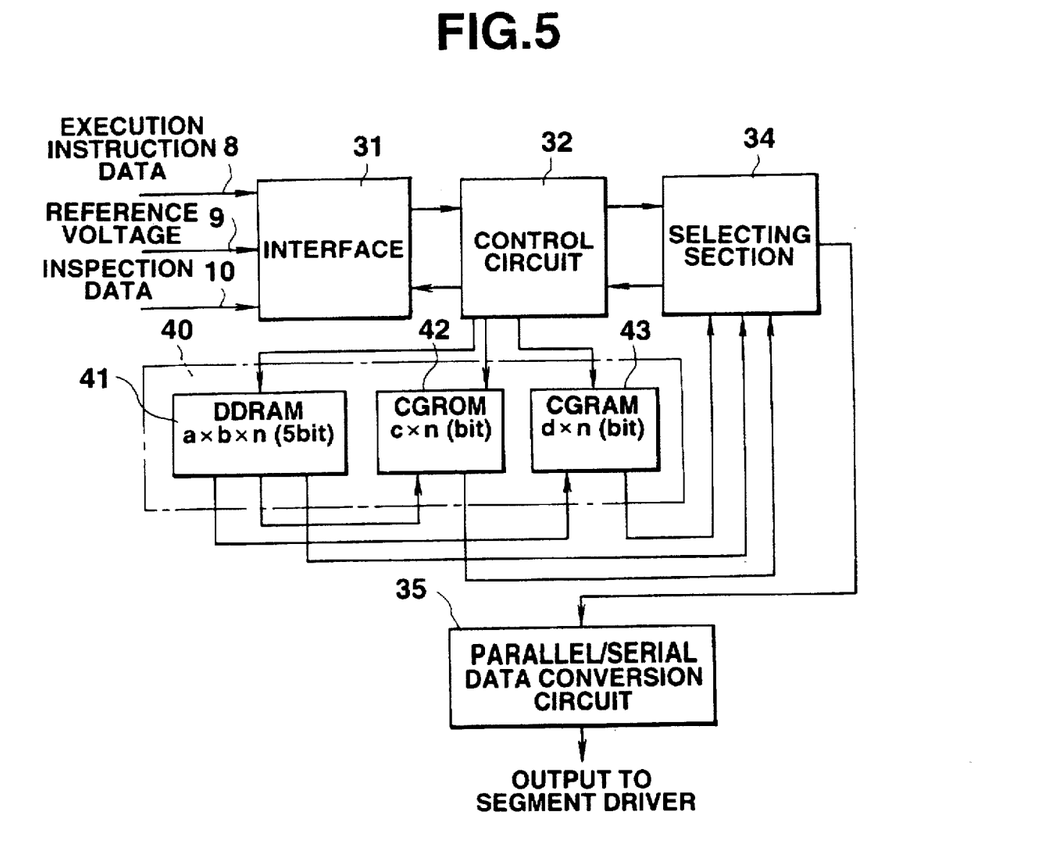
FIG. 5 is a block diagram of the memory section and its peripheral circuits.

The liquid-crystal display driving device 3 comprises control section 30, power supply section 40, a memory section 50, selecting section 60, and driving section 70. The control section 30 contains an interface 31 and a control circuit 32. The memory section 50 contains a DDRAM 51, a CGROM 52, and a CGRAM 53. The driving section 70 contains a parallel/serial data conversion circuit 71, a segment driver 72, and common driver 73.

Figure 6:
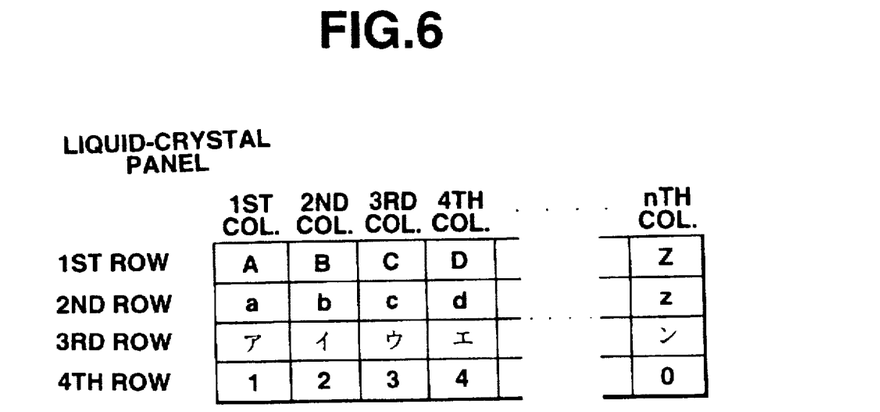
FIG. 6 is an example of the liquid-crystal display.
Figure 8:
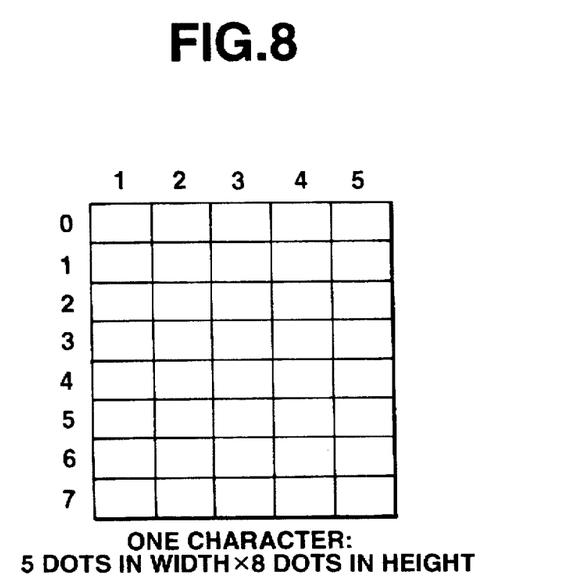
FIG. 8 shows the character dot structure in the CGROM and CGRAM.

In the liquid-crystal panel 2, a plurality of scanning lines and a plurality of segment lines are arranged in a matrix.

with the liquid-crystal panel 2, 40 dots consisting of 8 scanning lines and 5 segment lines constitute one character as shown in FIGS. 6 and 8. The liquid-crystal panel 2 has a display area for 4×n characters over the addresses corresponding to rows for 4 characters and n columns.

Using FIGS. 1 to 8, the operation of the liquid-crystal display driving device 8 installed on the liquid-crystal display module 1 will be described.

The control section 30 operates as follows. The interface 31, receiving the execution instruction data 8 and reference voltage 9 from the inspection device 4 via the FPC 28, outputs the inspection data 10 to the inspection device 4.

The reference voltage 9 inputted to the interface 31 is supplied as a logic power supply to each circuit of the liquid-crystal display driving device 3. The voltage is also inputted to the power supply section 40 that generates a plurality of liquid-crystal display driving voltage from the reference voltages 9.

The interface 31 has the function of converting the voltage levels of various signals exchanged between the liquid-crystal display driving device 3 and the inspection device 4.

The control circuit 32 has the function of sorting out signals into various inspection data execution instruction signals, memory address specification for the memory section 50, and character data on the basis of the execution instruction data 8 serially inputted from the inspection device 4. The control circuit generates various control signals through the decoding.

A first control signal is outputted to the selecting section 60, which has the function of selecting and reading the character data at particular addresses from the various character data items stored in each memory in the memory section 50, and switching between the outputting of the character data as inspection data 10 to the inspection device 4 via the control circuit 32 and interface 31 and the outputting of the character data to the driving section 70 to drive the liquid-crystal panel 2.

A second control signal is outputted to each memory in the memory section 50. When a particular character pattern is written at particular memory addresses in the CGRAM 53, the second control signal causes the serially inputted character data to be converted into parallel data and written into the CGRAM 53. Furthermore, the second control signal specifies the memory, the display address, the memory address, and the write/read process for each of DDRAM 51, CGROM 52, and CGRAM 53.

A third control signal is outputted to the segment driver 72 and the common driver 73. The third control signal is made up of several types of driving control signals for driving the liquid-crystal panel 2, and includes a synchronizing signal, a shift clock signal, a scanning start signal, an inverted signal, a latch output signal, and a data sampling signal.

The control circuit 32 receives the parallel character data from the selecting section 60, decodes it into a serially coded signal, and outputs the decoded inspection data 10 to the interface 31.

The memory section 50 operates as follows. The DDRAM 51 writes and reads particular memory addresses in the specified CGROM 52 and CGRAM 53 into and from the display addresses corresponding to the display positions on the basis of the display addresses at which the liquid-crystal panel 2 displays characters and the memory addresses specified by the execution instruction data 8. The DDRAM has a memory capacity of character rows×character columns×n bits.

The CGROM 52 is a memory that reads the already written character data on the basis of the execution instruction data 8 and has a memory capacity of C characters×n bits.

The CGRAM 53 is a memory that can write particular character data at particular memory addresses on the basis of the execution instruction data 8 and read the written character data by specifying read for the memory addresses. The CGRAM has a memory capacity of d characters×n bits.

Figure 7:
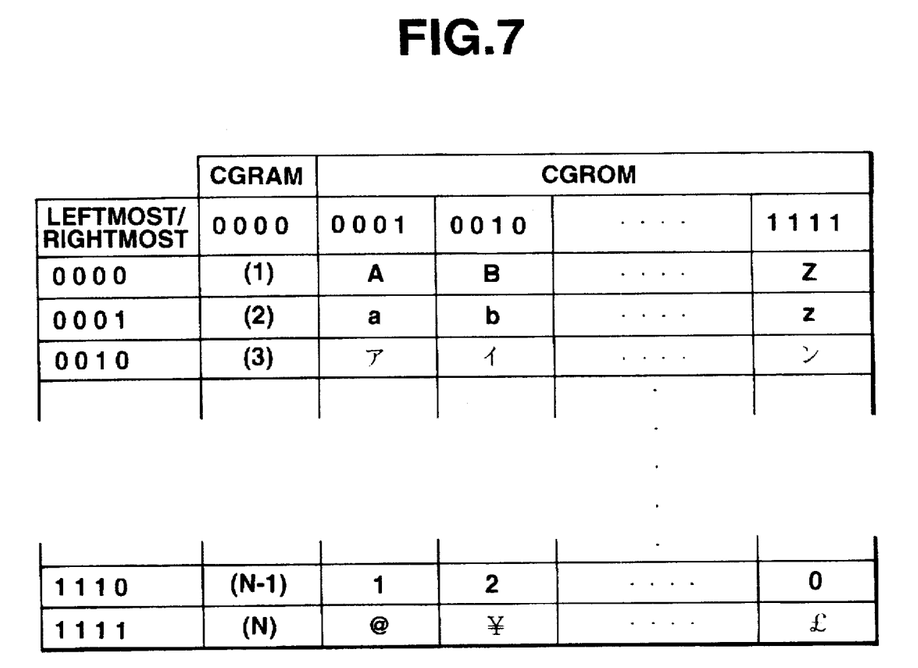
FIG. 7 is a table in which character codes correspond to character patterns.

FIG. 7 shows how character codes correspond to character patterns in the CGROM 52 and CGRAM 53. The character codes determine addresses in the memory.

One character=a character code of 4 leftmost bits+4 rightmost bits, represents one memory address.

The storage area of the CGROM 52 is given 00010000 to 11111111 and is a read-only memory. For example, "00010000" is a memory address corresponding to character pattern "All" written in the CGROM 52. The storage area of the CGRAM 53 is given 00000000 to 00001111 and is a memory that enables the writing and reading of (N) characters.

FIG. 8 shows the dot structure of a single character in the CGROM 52 and CGRAM 53. A single character is displayed using 5 dots in width×8 dots in height. In the case of scroll display, a single character is displayed using 6 dots in width×8 dots in height without displaying the sixth dot in width. In this way, at single memory addresses in the CGROM 52 and CGRAM 53, a character pattern with a character of 40 dots is stored.

As described above, to write particular character data at a particular address in the CGRAM 53, a single character of 40 bits of parallel character data converted at the control circuit 32 is written on the basis of the execution instruction data 8.

When the character data written in the CGROM 52 and CGRAM 53 is read out, the CGROM 52 and CGRAM 53 read the character data line by line as parallel data from the memory for which reading has been specified, referring to the memory addresses corresponding to the display addresses stored in the DDRAM 51 on the basis of the execution instruction data 8. Then, they output the read-out data to the selecting section 60.

The selecting section 60 operates as follows. The selecting section 60 switches between the outputting of the various character data items stored in the memory section 50 to the driving section 70 to drive the liquid-crystal panel 2 and the outputting of the character data items as inspection data 10 to the inspection device 4 via the control circuit 32 and interface 31, under the control of the control signal outputted from the control signal 32 on the basis of the execution instruction data 8.

The driving section 70 operates as follows. The driving section 70 comprises a parallel/serial data conversion circuit 71, a segment driver 72, and a common driver 73. The parallel/serial data conversion circuit 71 converts the parallel character data outputted from the CGROM 52 or CGRAM 53 selected at the selecting section 60 into serial data on the basis of the execution instruction data 8, and outputs the serial data to the segment driver 72 common line by common line on the liquid-crystal panel 2.

The segment driver 72 comprises a shift register (not shown) corresponding to the segment lines of the liquid-crystal panel 2, a latch circuit that latches each data item in the shift register, a gradation signal generating circuit that generates a gradation signal, and a multiplexer that selects a plurality of driving voltages depending on whether the display state is selected or not, and outputs a segment signal to the liquid-crystal panel 2.

The segment driver 72 generates a gradation driving signal from the display control signal inputted from the control circuit 32, the driving voltages supplied from the power supply section 40, and the serial data supplied from the parallel/serial data conversion circuit 71, and outputs a segment signal to each segment line of the liquid-crystal panel 2 in synchronization with a common signal explained later.

The common driver 73 is composed of a shift register (not shown) corresponding to the common line of the liquid-crystal panel 2, and a multiplexer that selects a plurality of driving voltages depending on whether the common line to be linearly driven in sequence is selected or not, and outputs a common signal to the liquid-crystal panel 2.

The common driver 73 uses the display control signal from the control circuit 32 and the driving voltages supplied from the power supply section 40 to sequentially output the generated common signal to the common line of the liquid-crystal panel 2.

The power supply section 40 operates as follows. The power supply section 40 comprises a step-up circuit (not shown) that quadruples the reference voltage 9, and a liquid-crystal display driving voltage generator (not shown) that generates a plurality of liquid-crystal display driving voltages (V0, V1, V2, V3, and V4) from the stepped-up voltage. The driving voltages generated at the power supply section 40 are outputted to the segment driver 72 and common driver 73.

Hereinafter, using FIGS. 1, 2, 6, 7, and 8, the operation of the inspection device 4 will be explained.

The inspection device 4 operates as follows. The inspection device 4 comprises a controller 5, determining section 6, and a terminal section (not shown) that can be connected to the connector provided on the terminal of the FPC 28 of the liquid-crystal display module 1.

The controller 5, although not shown in detail, comprises a memory that stores the inspection execution procedure necessary for inspection of the liquid-crystal display module 1 and a memory that stores inspection character data. The controller generates execution instruction data 8 and a synchronizing signal for synchronizing the liquid-crystal display module 1 with the inspection device 4.

As shown in FIGS. 7 and 8, the determining section 6 makes comparison and determination on the basis of the inspection character data to be written at particular memory addresses contained in the execution instruction data 8 outputted from the controller 5 to the liquid-crystal display module 1 and the inspection data 10 inputted from the liquid-crystal display module 1 to the controller 5.

The determining section 6 receives the image data into which the camera 7 has digitally converted the image data 11 on the moving picture or still picture on the liquid-crystal panel 2, and makes determination by comparing the particular display addresses of the liquid-crystal panel 2 with the previously stored inspection character data.

Figure 9:
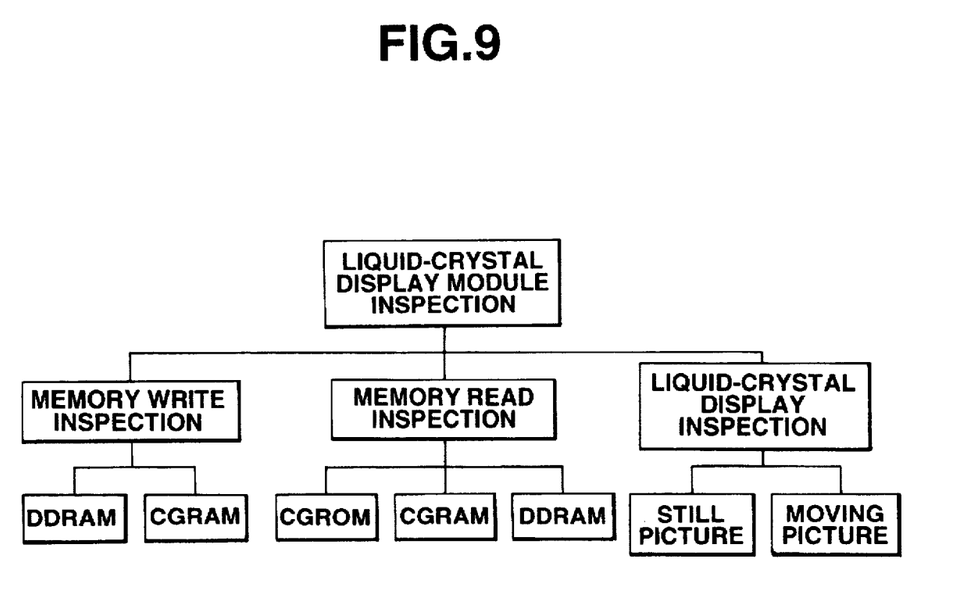
FIG. 9 is an information item table.

Using FIGS. 1 to 9, a method of inspecting the liquid-crystal module 1 will be described. FIG. 9 shows an inspection item table.

Inspection of the liquid-crystal panel 1 includes memory write inspection, memory read inspection, and liquid-crystal display inspection. The objects of memory write inspection are DDRAM 51 and CGRAM 53.

In the memory write inspection of DDRAM 51, the particular memory addresses written in the CGROM 52 and CGRAM 53 are written sequentially into the particular display addresses corresponding to the liquid-crystal panel 1 in the DDRAM 51 on the basis of the inspection character data contained in the execution instruction data 8.

In the memory write inspection of CGRAM 53, the particular inspection character data is written sequentially into the particular memory addresses in the CGRAM 53 on the basis of the inspection character data contained in the execution instruction data 8.

The inspection character data consists of 40 bits, 5 dots in width and 8 dots in height. Each dot can be turned on and off arbitrarily to form characters, symbols, or pictures. The inspection character data provides several types of test patterns. The objects of memory read inspection are DDRAM 51, CGROM 52, and CCRAM 53. In the read inspection of DDRAM 51 and CGRAM 53, the inspection character data written in the particular addresses in the memory write inspection is read out on the basis of the execution instruction data 8, and collation is effected. In the read inspection of CGROM 52, the character data already written in the particular addresses is read out on the basis of the execution instruction data 8, and collation is effected.

The objects of liquid-crystal display inspection are still pictures and moving pictures. In this inspection, the character data read out in the read inspection is outputted by the selecting section 60 to the driving section 70 side, and the displayed image data 11 is recognized through the camera 7. In the inspection of still pictures, a check is made to see if a particular character is displayed in a particular position on the liquid-crystal panel 2.

In the inspection of moving picture, a check is made by scrolling the character data read from the right end toward the left end of the liquid-crystal panel 2.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A display driving device comprising:
    a memory for storing a plurality of data items;
    control section for respectively controlling writing of data into and reading of data from said memory, on the basis of an execution instruction supplied by an inspection device used to inspect the condition of said memory;
    A driver for driving a display panel having a pair of substrates; and
    A selector for selectively switching between:
        (i) outputting of the data items stored in said memory to said inspection device through said control section, and
        (ii) outputting of the data items stored in said memory to said driver, on the basis of said execution instruction.

2. A display driving device according to claim 1, wherein said display driving device comprises a one-chip semiconductor element which is mounted on one of said pair of substrates of said display panel.

3. A display driving device according to claim 1, wherein said memory comprises:
    a ROM into which a plurality of predetermined data items have been written;

a RAM into and from which data items can be written and read, respectively, on the basis of said execution instruction; and an expansion RAM into and from which data items can be written and read, respectively, by expanding particular addresses in said ROM and said RAM over particular addresses in said display panel, on the basis of said execution instruction.

4. A display driving device according to claim 1, further comprising a terminal section for externally outputting the plurality of data items written in said memory, on the basis of said execution instruction.

5. An inspection method comprising:

a modularizing step of coupling a display driving device and a display panel to each other so as to form a display module, said display driving device having a memory for storing output data and said display panel having terminals to be coupled to said display driving device;

a coupling step of coupling said display driving device of said display module to an inspection device which supplies instructions to said display driving device;

a transferring step of transferring the output data stored in said memory of said display driving device to said inspection device on the basis of an instruction supplied by said inspection device, without converting the outer data stored in said memory to an image to be displayed on the display panel; and an inspecting step of inspecting the output data transferred to said inspection device in order to inspect the condition of said memory.

6. An inspection method according to claim 5, further comprising a step of selectively switching between (i) outputting of the output data stored in said memory to said inspection device, and (ii) outputting of the output data stored in said memory to said display panel, on the basis of the instruction supplied by said execution instruction.

7. An inspection method according to claim 5, wherein said memory of said display driving device comprises:

a ROM into which a plurality of predetermined data items have been written;

a RAM into and from which data items can be written and read, respectively, on the basis of said instruction supplied by said inspection device; and an expansion RAM into and from which data items can be written and read, respectively, by expanding particular addresses in said ROM and said RAM over particular addresses in said display panel, on the basis of said instruction supplied by said inspection device.

* * * * *